US012768868B2

(12) United States Patent
Ogirko et al.

(10) Patent No.: US 12,768,868 B2
(45) Date of Patent: Oct. 20, 2026

(54) SIGMA-DELTA MODULATOR (SDM) OVERLOAD DETECTOR CIRCUIT

(71) Applicant: Cypress Semiconductor Corporation, San Jose, CA (US)

(72) Inventors: Roman Ogirko, Lviv (UA); Edward Gerard O'Malley, Claremorris (IE); Cathal O'Lionaird, Cork (IE)

(73) Assignee: Infineon Technologies Americas Corp., El Segundo, CA (US)

( * ) Notice: Subject to any disclaimer, the term of this patent is extended or adjusted under 35 U.S.C. 154(b) by 169 days.

(21) Appl. No.: 18/780,766

(22) Filed: Jul. 23, 2024

(65) Prior Publication Data

US 2026/0029443 A1 Jan. 29, 2026

(51) Int. Cl.
*H03M 1/12* (2006.01)
*G01R 19/165* (2006.01)

(52) U.S. Cl.
CPC . *G01R 19/16528* (2013.01); *G01R 19/16504* (2013.01)

(58) Field of Classification Search
CPC .................... G01R 19/16528; G01R 19/16504
USPC .......................................................... 341/155
See application file for complete search history.

(56) References Cited

U.S. PATENT DOCUMENTS

| | | | | |
|---|---|---|---|---|
| 4,951,051 | A * | 8/1990 | Place | H03M 1/129 341/120 |
| 7,053,807 | B1 * | 5/2006 | Gaalaas | H03M 3/36 341/172 |
| 9,859,915 | B2 * | 1/2018 | Alavi | H03F 3/189 |
| 2007/0035429 | A1 * | 2/2007 | Schreier | H03M 3/376 341/143 |
| 2014/0240153 | A1 * | 8/2014 | Das | H03M 3/362 341/143 |

* cited by examiner

*Primary Examiner* — Jean B Jeanglaude

(57) ABSTRACT

An overload detector circuit includes first logic circuitry and second logic circuitry. The first logic circuitry to receive a bitstream from a sigma-delta modulator (SDM) of a receiver channel, the first logic circuitry to compare a current bit of the bitstream with a previous bit of the bitstream and output an indication of as match. The second logic circuitry to track a number of consecutive matches in the bitstream and output an indication of a first overload condition responsive to the number of consecutive matches satisfying a first threshold criterion.

20 Claims, 8 Drawing Sheets

190

| Time 191 | Input 192 | Current Bit 193 | Previous Bit 194 | Counter Value 195 |
|---|---|---|---|---|
| $T_0$ | 1 | 1 | X | 0 |
| $T_1$ | 1 | 1 | 1 | 1 |
| $T_2$ | 1 | 1 | 1 | 2 |
| $T_3$ | 1 | 1 | 1 | 3 |
| $T_4$ | 0 | 0 | 1 | 0 |
| $T_5$ | 0 | 0 | 0 | 1 |
| $T_6$ | 0 | 0 | 0 | 2 |
| $T_7$ | 1 | 1 | 0 | 0 |

FIG. 1C

SIGMA-DELTA MODULATOR (SDM) OVERLOAD DETECTOR CIRCUIT

TECHNICAL FIELD

This disclosure relates to detection circuits, and more specifically, to detecting overload conditions while using a sigma-delta modulator (SDM).

BACKGROUND

Components of an electrical device or system can communicate with data signals. For example, one or more components of the electrical device or system can collect information, convert the information into data signals, and make determinations based on the data signals. Often these electrical devices can interact with a user (e.g., human) in the physical world through a user interface (UI). These electrical devices are also known as human interface devices (HID). One type of HID that is increasingly more common is a touch-sensing device. Touch sensing device can include touch-sensor pads (also commonly referred to as touchpads), touch-sensor sliders, touch-sensor buttons, touch-sensor keyboards, touchscreens, and touch panels.

Some touch sensing devices can operate by detecting small changes in capacitance in an electrical circuit. For example, a sensing element in a touch sensing device can be made up of grid of transmitter (TX) electrodes and receiver (RX) electrodes. When a finger touches a sensor element, or is in close proximity to the sensing element, the capacitive coupling between the receiver electrode and the transmitter electrode is decreased as the finger shunts part of the electrical field to ground (e.g., chassis or earth ground). The sensing element can be connected to a processing element which can determine (i) whether a touch event occurred, and (ii) a location of the touch event relative to the grid of transmitter electrodes and receiver electrodes.

BRIEF DESCRIPTION OF THE DRAWINGS

FIG. 1C is an example table, illustrating a change to a count value of an overload detector circuit over time, according to at least one aspect of the disclosure.

DETAILED DESCRIPTION

Figure 1A:
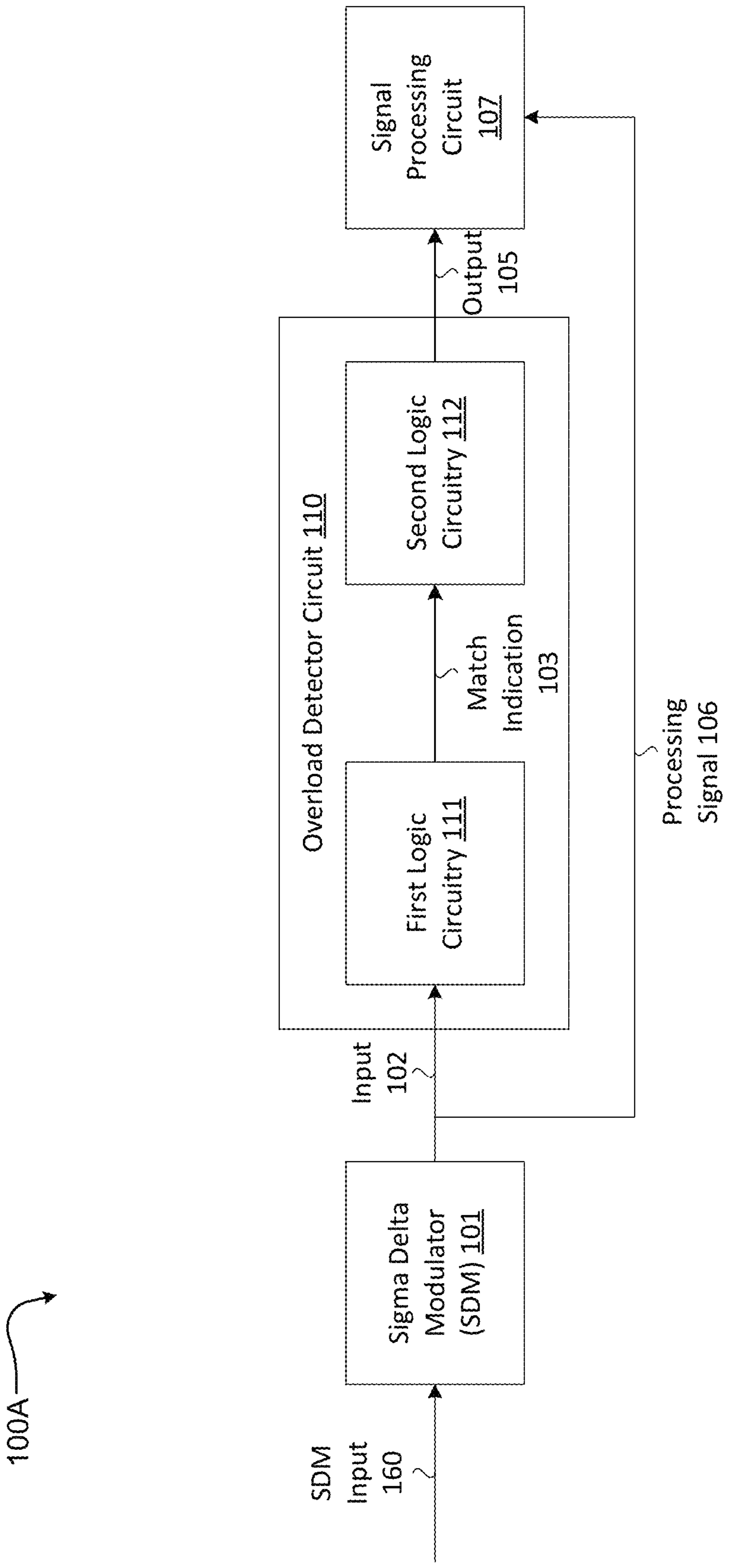
FIG. 1A is an example block diagram illustrating an overload detector circuit, according to at least one aspect of the disclosure.

The following description sets forth numerous specific details such as examples of specific systems, devices, components, methods, and so forth, in order to provide a good understanding of various embodiments of a sigma-delta modulator (SDM) overload detector circuit. The SDM overload detector circuit can detect and report the occurrence of an overload condition. As used herein, an "overload condition" occurs when the analog input signal to an analog-to-digital converter (ADC), such as an SDM, exceeds a maximum voltage range that the ADC can accurately convert into a digital output (e.g., the dynamic range of the ADC). Overload conditions can cause clipping, saturation, digital wrapping, quantization errors, offset errors, loss of information, and the like in digital outputs from an ADC. Often, circuits coupled to an ADC and/or the ADC itself will include circuitry designed to detect for and/or filter out the unusable data generated during an overload condition.

Often electrical devices can rely on an ADC to measure small deviations in an electrical signal. Despite increasingly fast ADCs, the response time can still be related to a signal stabilization stage for the ADC to collect enough signal information. ADCs often provide an output after sampling multiple clock cycles of input data (sometimes exceeding 100-1000 cycles). The output from the ADC can often be averaged over a set of clock cycles. The limitations of the ADC can lead to two challenges: (i) a delay in processing input data, and (ii) loss of data if a spike in the input is significantly shorter than the averaging clock cycle period. In systems that use an ADC to measure deviations in an electrical signal, these limitations can, for example, lead to an increase in error-detection time and/or latency experienced by the user or a decrease in error-detection accuracy and/or responsiveness of the system. For example, a capacitive touch screen often filters mis-touches (e.g., touch sensor errors) before processing the user interaction. This operation can often be referred to as a "debouncing" or "jitter-reduction" technique and can be used to reduce the amount of noise in the input signal by waiting for the input signal to return to a steady state.

Also, electrical systems can have electrical signals for which small variations indicate large changes in the state of one or more components of the electrical system. For example, in an energy storage system, a change in the voltage of a battery cell of just 3% can indicate a battery charge depletion from 80% to 20%. In another example, capacitive touch screens which can be used to detect a touch/no touch and location of a touch can have a touch sensor deviation ranging from approximately 2%-15%. Using a slower ADC, or an ADC with a longer settling time can increase the amount of time to detect these types of small changes. Additionally, when tuned to detect small changes, the dynamic range of ADCs may be reduced to capture the small variations more accurately in the electrical signals, which in turn can increase the likelihood that the ADC experiences an overload condition. In functional safety systems, it can be critical to accurately detect small variations in an electrical signal. Quick and accurate detection of small variations in an electrical signal can prevent a system from making a wrong determination. However, often systems that are used to detect small variations more quickly and accurately in a signal can have large components, and are still dependent on the ADC settling time described above.

Aspects of the present disclosure address the above and other deficiencies by providing an SDM overload detector circuit. As used herein, sigma-delta modulator (SDM) (also known as a "delta-sigma modulator") is a particular type of ADC that operates by oversampling the input signal at a frequency much higher than the Nyquist rate (i.e., .g., the frequency twice as high as the highest frequency in a signal) to produce a high-resolution output. The SDM uses a feedback loop to continuously compare the input signal with a quantized version of the input signal. This causes the SDM to generate a high-frequency stream of 1-bit digital data, herein referred to as a "bitstream." In some embodiments, aspects of the disclosure provide various methods and systems in which an SDM overload detector circuit can detect an overload condition in an electrical signal. While many of the examples and descriptions provided relate to capacitive touch screen implementations, it can be appreciated by those skilled in the art that these methods and systems can be applied in various other applications to quickly detect small changes in electrical signals. In particular, these methods and systems can be applied in applications where fast and accurate detection of an overload condition of a signal with a relatively small dynamic range is desirable.

In some embodiments, an overload detector circuit is coupled to the output of a modulator, such as an SDM. The overload detector circuit can process the output of the SDM to determine whether a first, or current value of a signal matches a second, or previous value of the signal. In some embodiments, the previous value of the signal can be obtained from a delayed version of the signal, i.e., a delayed signal. Upon determining the current value matches the previous value, the overload detector circuit can increment a count value. Once the count value exceeds an overload threshold, the count value can generate an indication of an overload condition. If the overload detector circuit fails to increment the count value, the count value can be reset. For example, if at a first clock cycle the overload detector circuit increments the count value from four to five, and at a second clock cycle the overload detector circuit does not increment the count value from five to six, the count value can be reset to zero. In this way, the overload detector circuit can detect and report a number of consecutive indications of a match between the current value and the previous value. The number consecutive indications of a match between the current value and the previous value can represent whether the SDM experienced an overload condition from an input signal to the SDM. The overload detector circuit can determine whether the number of consecutive matches satisfies a threshold criterion, such as an overload threshold value. In at least one embodiment, the overload detector circuit can detect an overload condition from the modulator output signal approximately ten times (or more) faster than a conventional ADC could detect the same overload condition.

Advantages of the present disclosure include, but are not limited to, a decreased detection time for an overload condition corresponding to an output from the SDM, decreased response time to process user inputs, an increased accuracy in processing user inputs, and a decrease in the quantity of false touch detections (i.e., detections of touch when no touch has occurred). Implementing the SDM overload detector circuit in user interface systems, such as in an automobile can provide additional functional safety advantages such as an increased responsiveness to one or more of a control system of the automobile, an information/entertainment ("infotainment") system of the automobile, climate control system of the automobile, and the like. The increased responsiveness and predictability of these systems can allow a driver to focus on driving, which can generally improve the functional safety of the automobile. Additional advantages will be apparent to those skilled in the art of capacitive sensing, and small signal sensing generally, as is further described below.

For example, battery discharge in a system and charge state reports to a user can be improved with quicker and more accurate measurements of charge values of battery cells, particularly battery packs that contain multiple battery cells. In another example, detecting true user touches as well as the location of user touches can be improved with quicker and more accurate measurements of capacitive elements of a touch sensor. For instance, it can be desirable for a touch tensor (e.g., a touch panel or touch screen) in an automobile to detect locations of true touches of a user very quickly and accurately. This can provide a more responsive user interface that can decrease driver confusion or frustration, by as providing the proper function of the automobile in response to the user interacting with the touch sensor.

It can be noted that for ease of reference, that bitstreams as discussed herein can be numbered down from most-significant bit (MSB) on the left, to least-significant bit (LSB) on the right. For example, given the generic four-bit bitstream [$B_3$, $B_2$, $B_1$, $B_0$], "$B_3$" is the MSB appearing in the first position when reading from left-to-right, and "$B_0$" is the LSB appearing in the last position. As used herein, $B_0$ can also be referred to as bit_0, $B_1$ can also be referred to as bit_1, and so forth.

FIG. 1A is an example block diagram 100A illustrating an overload detector circuit 110, according to at least one aspect of the disclosure. The block diagram 100A includes a sigma-delta modulator (SDM) 101, an overload detector circuit 110, and a signal processing circuit 107.

The SDM 101 can generate input 102. In some embodiments, input 102 is a bitstream. In some embodiments the SDM 101 provides the input 102 to the first logic circuitry 111 of the overload detector circuit 110. In some embodiments, the SDM 101 is coupled to a receiver channel. Additional details regarding a coupling to a receiver channel are described below with reference to FIG. 2 and FIG. 5. For example, the SDM 101 can be coupled to one receiver channel amongst multiple receiver channels for a touch detection sensor, such as a capacitive touch screen. In some embodiments, the SDM 101 can use a feedback loop to compare a difference between the SDM input 160 and the feedback signal (i.e., input 102 of overload detector circuit 110). The difference can be quantized using a one-bit quantizer that produces an output represented as either a zero or a one. In some embodiments, the difference is quantized using a multi-bit quantizer. In some embodiments, the quantized noise is filtered and integrated to generate a high-resolution, low-noise digital output.

The first logic circuitry 111 receives the input 102. In some embodiments, the first logic circuitry 111 compares a current value of the input 102 with a previous value of the input 102. In some embodiments, the input 102 is a bitstream and the first logic circuitry 111 compares a current bit of the bitstream to a previous bit of the bitstream. In some embodiments, the first logic circuitry 111 outputs a match indication 103 that reflects whether the current value of the input 102 matches the previous value of the input 102. If the current value matches the previous value, the first logic circuitry 111 can output a match indication 103 reflecting the indication of the match. If the current value does not match the previous value, the first logic circuitry 111 can output a match indication 103 reflecting the indication of the non-match. In some embodiments, if the current value does not match the previous value, the first logic circuitry 111 refrains from outputting a match indication 103.

The second logic circuitry 112 receives the match indication 103. In some embodiments, the match indication 103 can indicate a match, or a non-match. In some embodiments, the second logic circuitry 112 tracks a number of consecutive matches in the bitstream. The second logic circuitry 112 can determine whether a previous match indication reflected an indication of a match. If a previous match indication and a current match indication (i.e., match indication 103) are the same (they match), the second logic circuitry can decide to increase the tracked number of consecutive matches. In some embodiments, the second logic circuitry 112 determines whether the number of consecutive matches satisfies a threshold criterion. In some embodiments, if the number of consecutive matches satisfies the threshold criterion, the second logic circuitry 112 can output an indication of an overload condition. As illustrated, output 105 in FIG. 1A represents the indication of the overload condition. In some embodiments, the threshold criterion is set using hardware. For example, the threshold criterion can be set using a shift register. The number of serially coupled flip-flops in the shift register can be related to the threshold criterion for the number of consecutive matches that indicates an overload condition. In some embodiments, the threshold criterion is set using firmware and/or software. For example, the threshold criterion can be a digitally-set value that is stored in a memory structure. The digitally-set value can be compared to the number of consecutive matches that is tracked by the second logic circuitry 112. In some embodiments (e.g., firmware), the digitally-set value is initialized at startup of the overload detector circuit 110. In some embodiments (e.g., in software), the digitally-set value can be changed at run-time, or during operation of the overload detector circuit 110.

The signal processing circuit 107 can receive the output 105 from the second logic circuitry 112 of the overload detector circuit 110, and a processing signal 106 from the SDM 101. In some embodiments, the processing signal 106 represents a non-processed or filtered (i.e. "raw") output from the SDM 101. In some embodiments, the signal processing circuit 107 can perform one or more operations based on (i) an indication of an overload condition and (ii) the processing signal 106 received from the SDM 101. For example, and in some embodiments, if the output 105 indicates that an overload condition has occurred, the signal processing circuit 107 can disregard the processing signal 106. In another example, and in some embodiments, if the output 105 does not indicate that an overload condition has occurred, the signal processing circuit 107 can process the processing signal 106. For instance, the signal processing circuit 107 can determine a touch location on a capacitive touch screen based in part on the processing signal 106. In some embodiments, one or more elements of the overload detector circuit 110 can function in parallel with one or more elements of the signal processing circuit 107. In some embodiments, output 105, the indication of the overload condition is provided to additional circuitry for processing. Additional details are described below with reference to FIG. 2 and FIG. 5.

Figure 1B:
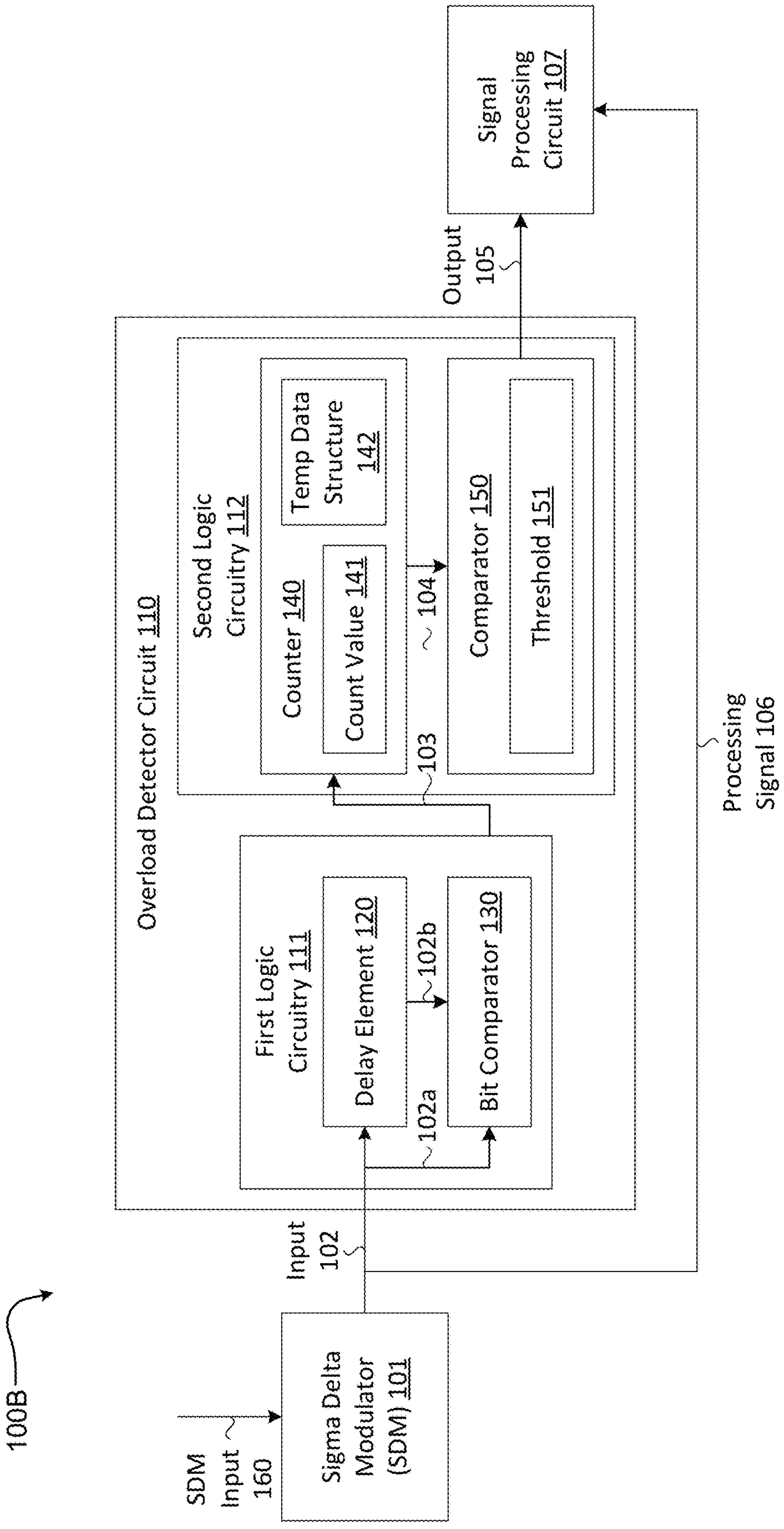
FIG. 1B is an example block diagram illustrating an overload detector circuit, according to at least one aspect of the disclosure.

FIG. 1B is an example block diagram 100B illustrating an overload detector circuit 110, according to at least one aspect of the disclosure. The block diagram 100B includes a sigma-delta modulator (SDM) 101 which receives an SDM input 160, an overload detector circuit 110, and a signal processing circuit 107.

The first logic circuitry 111 can include a delay element 120 and a bit comparator 130. In some embodiments, the input 102 is received by the delay element 120 and the bit comparator 130. In some embodiments, the delay element 120 receives the input 102 and generates a delayed input 102*b*. The delayed input 102*b* can include a previous value of the input 102. In some embodiments, the delay element 120 receives a portion of the input 102. In some embodiments, the delay element 120 receives the input 102 as a bitstream and generates a delayed bitstream. The delayed bitstream (i.e., delayed input 102*b*) can include a previous bit of the bitstream (i.e., input 102). In some embodiments, the delay element 120 delays the input 102 by one clock cycle. In some embodiments, the delay element 120 is and/or includes one or more of a flip-flop or a register. Additional circuitry can be used to otherwise delay the input 102 by one or more clock cycles.

In some embodiments, the bit comparator 130 receives the delayed input 102*b* and the input 102 (illustrated in FIG. 1B as input 102*a* which includes a current value of the input 102). If the current value of the input 102 (received as input 102*a* at the bit comparator 130) matches the previous value of the input 102 (received as delayed input 102*b* at the bit comparator 130), the bit comparator 130 generates a match indication 103 that reflects an indication of a match. If the current value of the input 102 (received as input 102*a* at the bit comparator 130) does not match the previous value of the input (received as delayed input 102*b* at the bit comparator 130), the bit comparator 130 generates a match indication 103 that reflects an indication of a non-match. Similar to the description above with reference to FIG. 1A, in some embodiments, if the current value of the input 102 does not match the previous value of the input 102, the bit comparator 130 refrains from generating a match indication 103.

The bit comparator 130 can receive the input 102*a* and the delayed input 102*b*. In some embodiments, the input 102*a* and the delayed input 102*b* can be time-shifted versions of the input 102. For example, the input 102*a* can be a current signal with a current value, and the delayed input 102*b* can be a delayed signal with a previous value. In at least one embodiment, the comparator component can be one or more of a bitwise exclusive-or (XOR) component or a bitwise exclusive-nor (XNOR) component. The bit comparator 130 can compare the input 102*a* to the delayed input 102*b*. For example, given an original bitstream [0, 1, 1, 0] (e.g., input 102*a*), and the corresponding delayed bitstream [0, 0, 1, 1] (e.g., delayed input 102*b*), the comparator component can generate the output [1, 0, 1, 0], representing that $B_0$ and $B_2$ of the original bitstream match values of the delayed bitstream.

In some embodiments, the bit comparator 130 can perform one or more functions of the delay component 120. In some embodiments, the bit comparator 130 can include a temporary data structure 142 that stores a value of the input received at the overload detector circuit 110. In some embodiments, the temporary data structure 142 can include one or more of a network of flip-flops or registers for storing single-bit information. In some embodiments, the temporary data structure can be one or more of a flip-flop or a register. In some embodiments, the temporary data structure can store one or more bits from a bitstream received at the overload detector circuit 110. In some embodiments, when determining whether a current value of the bitstream matches a previous value of the bitstream, the bit comparator 130 can compare the value stored at the temporary data (i.e., the previous value) to the current value of the bitstream. In some embodiments, the temporary data structure of the bit comparator 130 is overwritten with new data at each clock cycle of a clock signal. Additional details regarding clock cycles for the overload circuit overload detector circuit 110 are described below with reference to FIG. 2.

The second logic circuitry 112 can include a counter 140 and a comparator 150. In some embodiments, the match indication 103 is received by the counter 140 of the second logic circuitry 112. In some embodiments, the counter 140 determines (from a series of match indications) a number of consecutive matches. In some embodiments, if a previous match indication reflected the indication of a match (i.e., that the current value of input 102 and a previous value of input 102 are equal), and the match indication 103 reflects a match, the counter 140 increments a count value representing the number of consecutive matches. In some embodiments, if a previous match indication reflected an indication of a match, and the e.g., match indication 103 does not reflect an indication of a match, the counter resets the count value representing the number of consecutive matches.

In some embodiments, the counter 140 can increment the value of a count value 141 each time a consecutive value is received. In some embodiments, the count value 141 can be tracked by, for example, a temporary data structure 142, as described above.

FIG. 1C is an example table 190, illustrating a change to a count value 141 of a counter 140 of an overload detector circuit 110 over time $T_0$ to $T_7$, according to at least one aspect of the disclosure.

The example table 190 includes columns for time 191, input 192, current bit 193, previous bit 194, and counter value 195. In some embodiments, the input 192 is a bitstream. At time $T_0$, a current bit 193 of the input 192 is '1.'

At time $T_1$, a current bit 193 is '1,' and a previous bit is '1.' Since the current bit 193 and the previous bit 194 are the same value at time $T_1$ (i.e., both have a value of '1'), the counter value 195 can be incremented to 1 for time $T_1$.

At time $T_2$, the current bit 193 and the previous bit 194 both have a value of '1.' Thus, the counter value 195 can be incremented from 1 to 2 for time $T_2$.

At time $T_3$, the current bit 193 and the previous bit 194 both have a value of '1.' Thus, the counter value 195 can be incremented from 2 to 3 for time $T_3$.

At time $T_4$, the current bit 193 has a value of '0' and the previous bit 194 has a value of '1.' Since the current bit 193 and the previous bit 194 are different values at the time $T_4$, the counter value 195 can be reset to 0 for time $T_4$.

At time $T_5$, the current bit 193 and the previous bit 194 both have a value of '0.' Thus, the counter value 195 can be incremented from 0 to 1 for time $T_5$.

At time $T_6$, the current bit 193 and the previous bit 194 both have a value of '0.' Thus, the counter value 195 can be incremented from 1 to 2 for time $T_6$.

At time $T_7$, the current bit 193 has a value of '1' and the previous bit 194 has a value of '0.' Since the current bit 193 and the previous bit 194 are different values at the time $T_7$, the counter value 195 can be reset to 0 for time $T_7$.

Additional details regarding calculating the count value 141 are described below with reference to FIG. 3.

Returning to FIG. 1B, in some embodiments, the comparator 150 receives the number of consecutive matches 104 from the counter 140 as the count value 141. If the number of consecutive matches 104 satisfies a threshold criterion, such as the threshold 151, the comparator 150 can generate the output 105 that includes an indication of an overload condition. In some embodiments, the number of consecutive matches 104 satisfies the threshold 151 if the number of consecutive matches 104 is greater than or equal to a value of the threshold 151. In some embodiments, the value of the threshold 151 is set by one or more of hardware, firmware, or software. In some embodiments, the value of the threshold 151 is determined at one or more of pre-boot time, at startup, at runtime, or during operation of the overload detector circuit 110.

In some embodiments, the comparator 150 (or other element of the overload detector circuit 110) includes multiple threshold criteria. The number of consecutive matches 104 can be compared against each threshold criterion of the multiple threshold criteria. In some embodiments, satisfaction of a first threshold criterion can cause the comparator 150 to generate a first type of output such as an indication of a first overload criterion, while satisfaction of a second threshold criterion can cause the comparator 150 to generate a second type of output, such as an indication of a second overload criterion. In some embodiments, a first overload criterion can correspond to a brief touch, such as an accidental touch, or an object briefly striking the touch screen. In some embodiments, a second overload criterion can correspond to a prolonged touch, such as an object resting against a touch screen. These multiple threshold criteria can be used to generate less severe and/or more severe notifications. For example, a lower value of the count value 141 can indicate a less severe overload condition, and a higher value of the count value 141 can indicate a more severe overload condition. In some embodiments, it can be desirable for the processing logic of the device implementing the overload detector circuit 110 to perform different actions based on different severities of detected overload conditions. For example, a first action can be performed when a first threshold criterion is satisfied, a second action can be performed when a second threshold criterion is satisfied, and so forth.

In some embodiments, the comparator 150 compares a value of the threshold 151 to the number of consecutive matches 104 using one or more of digital hardware logic or software. In some embodiments, the comparison between the count value 141 and the value of the threshold 151 is performed by one or more of an adder, a comparator, a shifter, an arithmetic logic unit (ALU), a floating-point unit (FPU), or a digital signal processor (DSP). In some embodiments, one or more functions of the comparator 150 are implemented as part of the counter 140. For example, and in some embodiments, the counter 140 can determine whether the count value 141 satisfies the threshold 151. In such embodiments, the comparator 150 can receive a binary one (e.g., "yes") or binary zero (e.g., "no"), and generate the output 105 accordingly.

Figure 2:
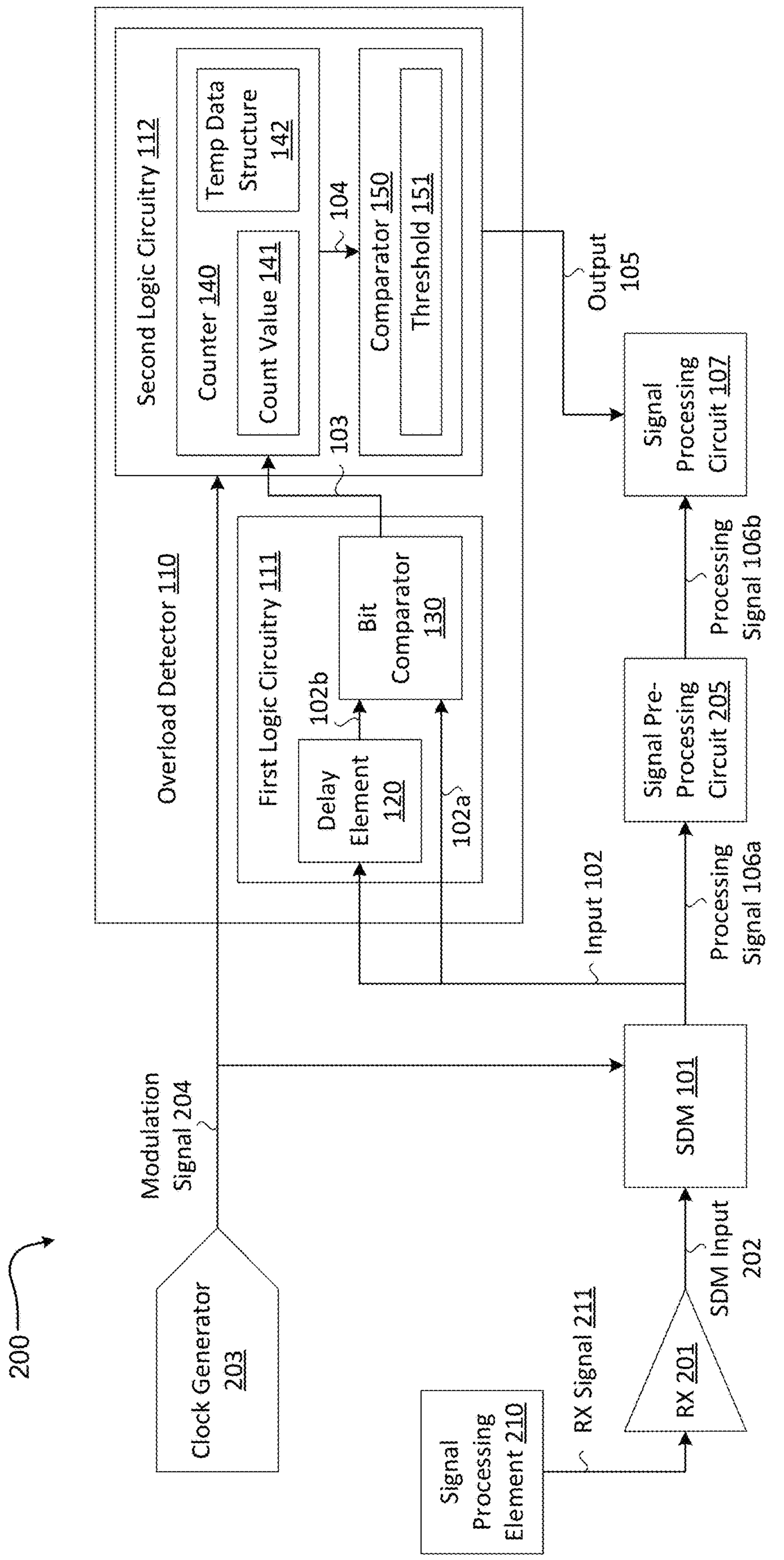
FIG. 2 is an example block diagram illustrating an overload detector, according to at least one aspect of the disclosure.

FIG. 2 is an example block diagram 200 illustrating an overload detector, according to at least one aspect of the disclosure. The block diagram 200 includes receiver (RX) 201, clock generator 203, signal pre-processing circuit 205, SDM 101, signal processing circuit 107, and overload detector circuit 110. SDM 101, signal processing circuit 107, and overload detector circuit 110 can be the same as the corresponding elements described with reference to FIGS. 1A and 1B, unless otherwise described. Additional descriptions for these elements are provided herein alongside the descriptions of the elements of FIG. 2.

The receiver 201 is a source of the SDM input 202. In some embodiments, the receiver 201 generates the SDM input 202 from an RX signal 211 received from a signal processing element 210 such as another portion of the circuit, a sensor, or the like. In some embodiments, the receiver 201 generates the SDM input from a signal received from a touch sensor, such as a capacitive touch screen. The SDM 101 can receive the SDM input 202 from the receiver 201. In some embodiments, the SDM 101 is an ADC that converts an analog signal into a digital value. In some embodiments, the SDM 101 can sample the SDM input 202 at a particular frequency of the clock signal 204 from the clock generator 203. In some embodiments, the digital output is generated as one or more of a continuous digital signal, a serial data signal, a bitstream, or the like. As illustrated, the output from the SDM 101 can be the input 102 of FIG. 1.

In some embodiments, the clock generator 203 is the source of the modulation frequency for the SDM 101. The clock generator 203 can generate a clock signal 204 having a modulation frequency. In some embodiments, the clock signal 204 is provided to the SDM 101. In some embodiments, the clock signal 204 is provided to one or more elements of the first logic circuitry 111, such as the delay element 120 or the bit comparator 130. In some embodiments, the clock signal 204 is provided to one or more elements of the second logic circuitry 112, such as the counter 140 or the comparator 150. As described above, the clock signal 204 can be selected to have a particular modulation frequency. The particular modulation frequency of the clock signal 204 corresponds to a sampling rate of the SDM 101 and a clock signal for one or more elements of the first logic circuitry 111 and/or one or more elements of the second logic circuitry 112. For example, and in some embodiments, the clock signal 204 can be a clock signal for the counter 140 to update the count value 141 and send the number of consecutive matches 104 to the comparator 150. For example, during a first exemplary clock cycle of the clock signal 204, the counter 140 can receive the match indication 103 and increment the count value 141 at the temporary data structure 142. During a second exemplary clock cycle, the counter 140 can send the number of consecutive matches 104 to the comparator 150. During a third exemplary clock cycle, the comparator 150 can generate an indication of an overload condition as the output 105 by comparing the number of consecutive matches 104 to the threshold 151. During a fourth exemplary clock cycle, the comparator 150 can send the output 105 to the signal processing circuit 107. It can be appreciated that these operations can be performed at different elements of the overload detector circuit 110, in a different sequence, and/or simultaneously, and that the above description of clock cycles is used only illustratively.

The output of the SDM 101 can be provided as the input 102 to the overload detector circuit 110 as described above with reference to FIG. 1A and FIG. 1B. In some embodiments, the output of the SDM 101 can be provided as the processing signal 106*a* to the signal pre-processing circuit 205. The signal pre-processing circuit 205 can generate the processing signal 106*b*. In some embodiments, the signal pre-processing circuit 205 can include one or more filters, logic elements, or circuits to generate the processing signal 106*b* from the processing signal 106*a*. In some embodiments, the signal pre-processing circuit 205 includes a low-pass filter. In some embodiments, the signal pre-processing circuit 205 includes a decimation element, which reduces the frequency rate of the processing signal 106*a* to produce the processing signal 106*b* having a relatively high-resolution, low-noise digital signal. In some embodiments and as described above with reference to processing signal 106 of FIG. 1A and FIG. 1B, the processing signal 106*b* can be provided to the signal processing circuit 107. It can be appreciated that as illustrated, input 102 and processing signal 106*a* are the same signal that has been relabeled at different points in FIG. 2 for clarity of description.

As similarly described above in FIG. 1A and FIG. 1B, the signal processing circuit 107 can receive the processing signal 106*b* from the signal pre-processing circuit 205 and the output 105 from the overload detector circuit 110. In some embodiments, the signal processing circuit 107 can cause one or more operations to be performed on the processing signal 106*b* based on the output 105 received from the overload detector circuit 110. By way of non-limiting example, and in some embodiments, the signal processing circuit 107 can determine that an RX signal 211 received at receiver 201 indicates a touched location of a touch screen sensor (e.g., a signal processing element 210). This can be determined based on an indication of no overload condition received in the output 105 and information such as a capacitance of a touch-receiver represented in the processing signal 106*b*.

Figure 3:
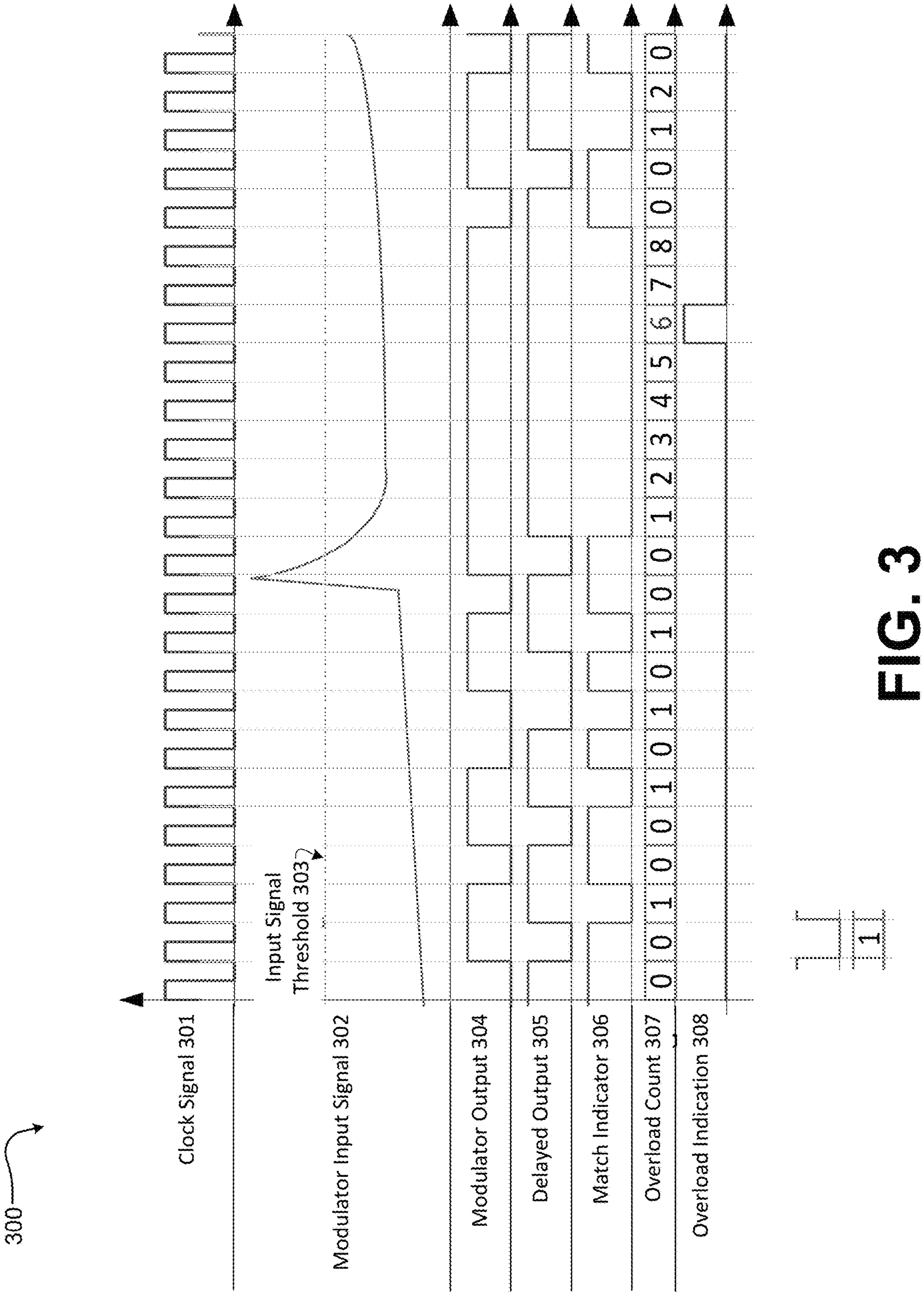
FIG. 3 illustrates a timing diagram for an overload detector circuit, according to at least one aspect of the disclosure.

FIG. 3 illustrates a timing diagram 300 for an overload detector, according to at least one aspect of the disclosure. The timing diagram 300 includes a clock signal 301 (e.g., clock signal 204 of FIG. 2), a modulator input signal 302 (e.g., SDM input 202 of FIG. 2), an input signal threshold 303, a modulator output 304 (e.g., input 102*a* of FIG. 1B), a delayed output 305 (e.g., delayed input 102*b* of FIG. 1B), a match indicator 306 (e.g., match indicator 103 of FIG. 1A or FIG. 1B), an overload count 307 (e.g., count value 141 of FIG. 1B), and an overload indication 308 (e.g., output 105 of FIG. 1A or FIG. 1B).

In some embodiments, the clock signal 301 is a repeating signal at a constant frequency. In some embodiments, the clock signal 301 is used as a sampling frequency by the SDM 101 of FIG. 1A or FIG. 1B. For example, the modulator input signal 302 can be sampled by the SDM 101 at the modulation frequency of the modulator input signal 302. In some embodiments, and as described in FIG. 2, the clock signal 301 can function as a clock signal for one or more elements of the overload detector circuit 110. For example, the modulator output 304 can be compared to the delayed output 305 by the bit comparator 130 to produce the match indicator 306 at each cycle of the clock signal 301. In another example, the value of the overload count 307 can be incremented (or reset) by the counter 140 at each cycle of the clock signal 301. In another example, the value of the overload count 307 can be compared to an overload threshold criterion such as threshold 151 of FIG. 1B by the comparator 150 at each cycle of the clock signal 301. In some embodiments, the frequency of the clock signal 301 can be approximately ten times greater than the highest frequency of the modulator input signal 302 that carries information.

In some embodiments, the modulator input signal 302 is a signal for which small deviations in the signal can indicate large changes in a system. For example, a 3-15% deviation in the capacitance of a portion of a capacitive touch screen can indicate a touch (e.g., 100% outcome) in comparison to a non-touch (e.g., 0% outcome). Additionally, in some embodiments, the modulator input signal 302 can already be relatively small. In some embodiments, capacitive elements of a capacitive touch screen are measured in, for example, nano-farads (nf) or pico-farads (pf).

In some embodiments, the modulator input signal 302 has a set dynamic range. As used herein, "dynamic range" is a ratio between the largest value and the smallest value of a signal, and can be represented linearly or logarithmically (e.g., such as in decibels (dB)). The input signal threshold 303 can represent an upper limit of the dynamic range of the modulator input signal 302. In some embodiments, when the modulator input signal 302 exceeds the input signal threshold 303, the SDM 101 can truncate, clip, or otherwise distort a portion of the modulator input signal 302. In some embodiments, this distortion of the modulator input signal 302 can cause the SDM 101 to produce a non-usable signal as the modulator output 304. In some embodiments, the modulator output 304 can stabilize several clock cycles after the modulator input signal 302 has exceeded the input signal threshold 303. Depending on the configuration of the SDM 101, the non-usable portion of the modulator output 304 can be represented in different ways. For example, as illustrated in FIG. 3 after the modulator input signal 302 for a particular one-bit modulator (i.e., SDM 101) exceeds the dynamic range of the SDM 101 (i.e., the input signal threshold 303), the modulator output 304 can (erroneously) remain in the "high" value position for several clock cycles of the clock signal 301. In another example, after the modulator input signal 302 exceeds the dynamic range of the SDM 101 (e.g., the input signal threshold 303), the modulator output 304 can (erroneously) remain in the "low" value position for several clock cycles of the clock signal 301. In some embodiments, the SDM 101 has experienced an overload condition when the modulator output 304 settles several clock cycles after the modulator input signal 302 exceeds the input signal threshold 303.

The modulator output 304 can represent the output from the SDM 101. In some embodiments, the modulator output 304 is a digital representation of a modulator input signal 302. In some embodiments, the modulator output 304 is a digital representation of the noise included in the modulator input signal 302. In some embodiments, the modulator output 304 is a representation of a number of balancing cycles to bring a circuit element of the SDM 101 back into a normal range of operation. For example, and in some embodiments, the SDM 101 includes an integrator circuit element. When the modulator input signal 302 exceeds the input signal threshold 303, the integrator circuit element can generate an output that exceeds the normal output from the integrator circuit element. The value of the modulator output 304 can be indicative of whether or not the integrator circuit output has returned to normal operation.

The delayed output 305 can represent a delayed version of the modulator output 304. In some embodiments, (and as illustrated in FIG. 3), the delayed output 305 is delayed by one clock cycle of the clock signal 301. In alternative embodiments, the delayed output 305 can be delayed by two or more clock cycles of the clock signal 301. In some embodiments, the delayed output 305 is generated by a logic circuit element (e.g., delay element 120 of FIG. 1) coupled to the output of the SDM 101, such as for example, a register or a flip-flop. In some embodiments, the delayed output 305 is not explicitly generated as a signal, but rather value of the modulator output 304 is stored during a first clock cycle. During a second clock cycle, the stored value (now a "previous value") is compared to a current value of the modulator output 304. This operation may be performed by a comparator component (e.g., bit comparator 130 of FIG. 1A or FIG. 1B) and/or a counter component (e.g., counter 140 of FIG. 1A or FIG. 1B).

The match indicator 306 can represent the result of comparing the modulator output 304 with the delayed output 305. In some embodiments, at each clock cycle of the clock signal 301 the bit comparator 130 determines whether a first, or current value of the modulator output 304 matches a second value of the delayed output 305 (i.e., a previous value). If the first value of the modulator output 304 matches the second value of the delayed output 305, the bit comparator 130 generates an indication of a match. In some embodiments, and as illustrated in FIG. 3, the indication of the match can be represented in the match indicator 306 as a digital low (i.e., a "0"). In some embodiments, the indication of the match can be represented in the match indicator 306 as a digital high (i.e., a "1"). If the first value of the modulator output 304 does not match the second value of the delayed output 305, the comparator can remain in a constant state (e.g., the opposite of the indication value, or a digital low and digital high respectively). As described above, in some embodiments, the delayed output 305 is represented by one or more values that are temporarily stored in a data structure, in register(s), in flip-flop(s), or the like. In such embodiments, the comparator output can compare a current value of the modulator output 304 to a stored, or previous value of the modulator output 304 represented as the delayed output 305. In some embodiments, the overload detector circuit 110 can indicate an overload condition with output 105 when the match indicator 306 remains at the same level for a certain quantity of consecutive clock cycles, representing a certain number of consecutive matches.

The overload count 307 can represent a quantity of consecutive clock cycles that the match indicator 306 remains at the same value. In some embodiments, at each clock cycle of the clock signal 301, the overload count 307 is incremented by one, or reset to zero. In some embodiments, the overload count 307 is incremented by one if the current value of the match indicator 306 is the same as the previous value of the match indicator 306. In some embodiments, the overload count 307 is reset to zero if the current value of the match indicator 306 is different from the previous value of the match indicator 306. In some embodiments, the number of consecutive clock cycles that the match indicator 306 remains at the same value represents a number of clock cycles that a first value of the modulator output 304 is the same as a second value (e.g., previous value) of the delayed output 305.

In some embodiments, a large quantity of consecutive cycles with the match indicator 306 remaining at the same value can indicate an abnormal operation (e.g., as defined by a threshold criterion, such as threshold 151 of FIG. 1B). For example, the modulator input signal 302 can have periodic highs and lows that are represented respectively as "1's" and "0's." The number of clock cycles that the modulator output 304 remains in either a digital high state or a digital low state can range, based on various factors. When the modulator output 304 remains in either a digital high state or a digital low state longer than a certain threshold, an overload indication can be generated. Often, the frequency of the clock signal 301 can be selected such that the output from the SDM 101 (e.g., modulator output 304) does not remain at a digital high or digital low for longer than a certain number of clock cycles of the modulator input signal 302 (i.e., a range of clock cycles). In the illustrative example of FIG. 3, the number of clock cycles the modulator output 304 remains at a high or low state during normal operation is two to five clock cycles. Thus, if the match indicator 306 remains at the same high or low state for more than the two to five clock cycles, the match indicator 306 can indicate a potential overload condition, as indicated by high value of the overload indication 308 at the overload count 307 value of '6.'

In some embodiments, the overload indication 308 can represent an indication of whether the overload count 307 satisfies an overload threshold (e.g., a threshold criterion such as threshold 151). The overload threshold can be configured based on the implementation of the overload detector circuit 110, as well as outputs from the modulator SDM 101. For example, a clock signal 301 can be selected such that during normal operation, the modulator output 304 remains at either a digital high state or a digital low state for a maximum number of clock cycles. If the modulator output 304 remains at a digital high state or a digital low state for more than the maximum number of clock cycles, the match indicator 306 (which represents a hysteretic output from the SDM 101) can indicate a potential overload condition.

In some embodiments, to avoid a false positive detection of an overload condition, an overload threshold that is greater than the maximum number of clock cycles can be selected. If the value of the overload count 307 satisfies the selected overload threshold criterion such as threshold 151, the overload indication 308 can change from a steady state to an "alert state" to indicate that an overload condition has occurred. As used herein, "alert state" can refer to the non-steady state of the overload indication 308. For example, when an overload does not occur, the overload indication 308 can remain at a constant steady state such as a digital high or a digital low. When an overload is detected, such as when the value of the overload count 307 satisfies the overload threshold, the overload indication 308 can change to an opposing state. In the illustrative FIG. 3, the alert state is triggered after five consecutive clock cycles of the modulator output 304 and the delayed output 305 having the same value. At the sixth clock cycle, the overload indication 308 transitions to the alert state for a single clock cycle. In some embodiments, the overload indication 308 can remain in the alert state until the overload count 307 is reset. In some embodiments, the system that is implementing the overload detector circuit 110 can perform one or more operations based on receiving the alert the reflects the overload indication 308 from the overload detector circuit 110.

In some embodiments, the overload detector circuit 110 can include more than one overload threshold. For example, the overload detector circuit 110 can have a first threshold criterion and a second threshold criterion, as described above with reference to FIG. 2.

Figure 4A:
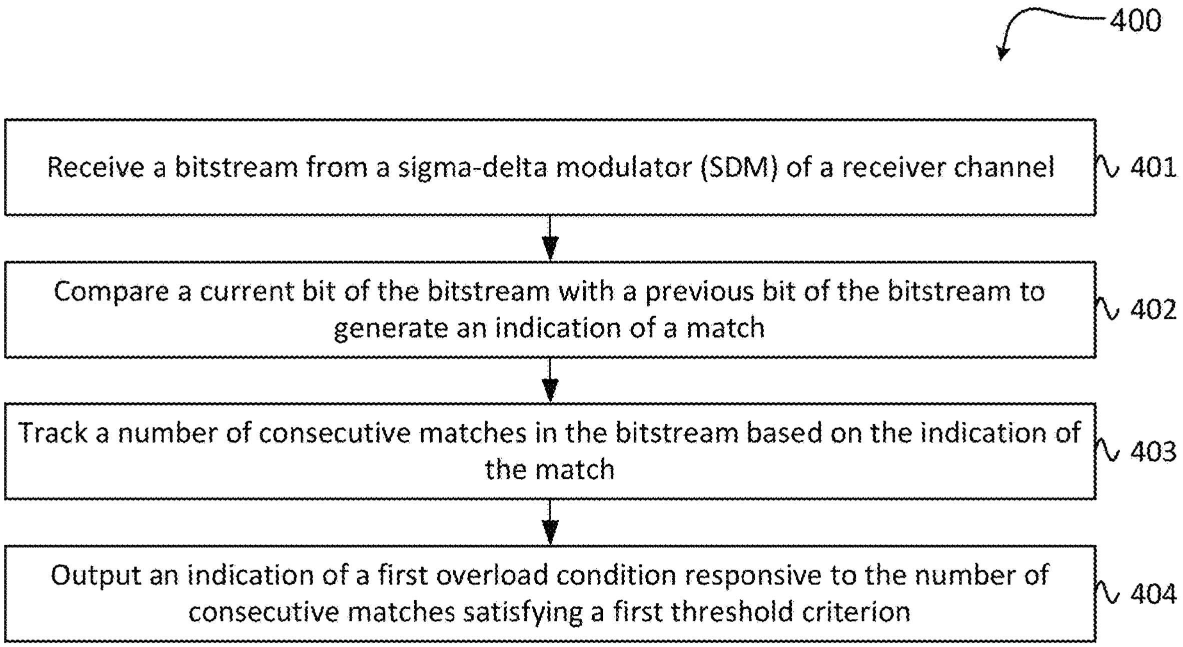
FIG. 4A is a flow diagram of an example method for generating an indication of an SDM overload condition, according to at least one aspect of the disclosure.

FIG. 4A is a flow diagram of an example method 400 for generating a sigma-delta modulator (SDM) overload indication, according to at least one aspect of the disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 can be performed by the overload detector circuit 110 of FIG. 1. Although illustrated in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more operations of the method 400 can be omitted in various embodiments. Thus, not all processes are required in every embodiment. Other process flows are possible.

At operation 401, processing logic, such as the overload detector circuit 110, receives a bitstream from a sigma-delta modulator (SDM) of a receiver channel. In some embodiments, a second bitstream can be received. In some embodiments, the second bitstream can be a delayed version of the first bitstream.

At operation 402, the processing logic compares a current bit of the bitstream with a previous bit of the bitstream to generate an indication of a match. In some embodiments, the previous bit of the bitstream is obtained from a second bitstream representing a delayed version of the bitstream.

At operation 403, the processing logic to track a number of consecutive matches in the bitstream based on the indication of the match. In some embodiments, the number of consecutive bits can be stored in a dedicated flip-flop, latch, register, or the like. In some embodiments, the number of consecutive matches can be incremented for each clock cycle where the current bit of the bitstream matches the previous bit of the bitstream.

At operation 404, the processing logic outputs an indication of an overload condition responsive to the number of consecutive matches satisfying a first threshold criterion. In some embodiments, the processing logic can generate an alert that includes an indication that includes the indication of the overload condition.

Figure 4B:
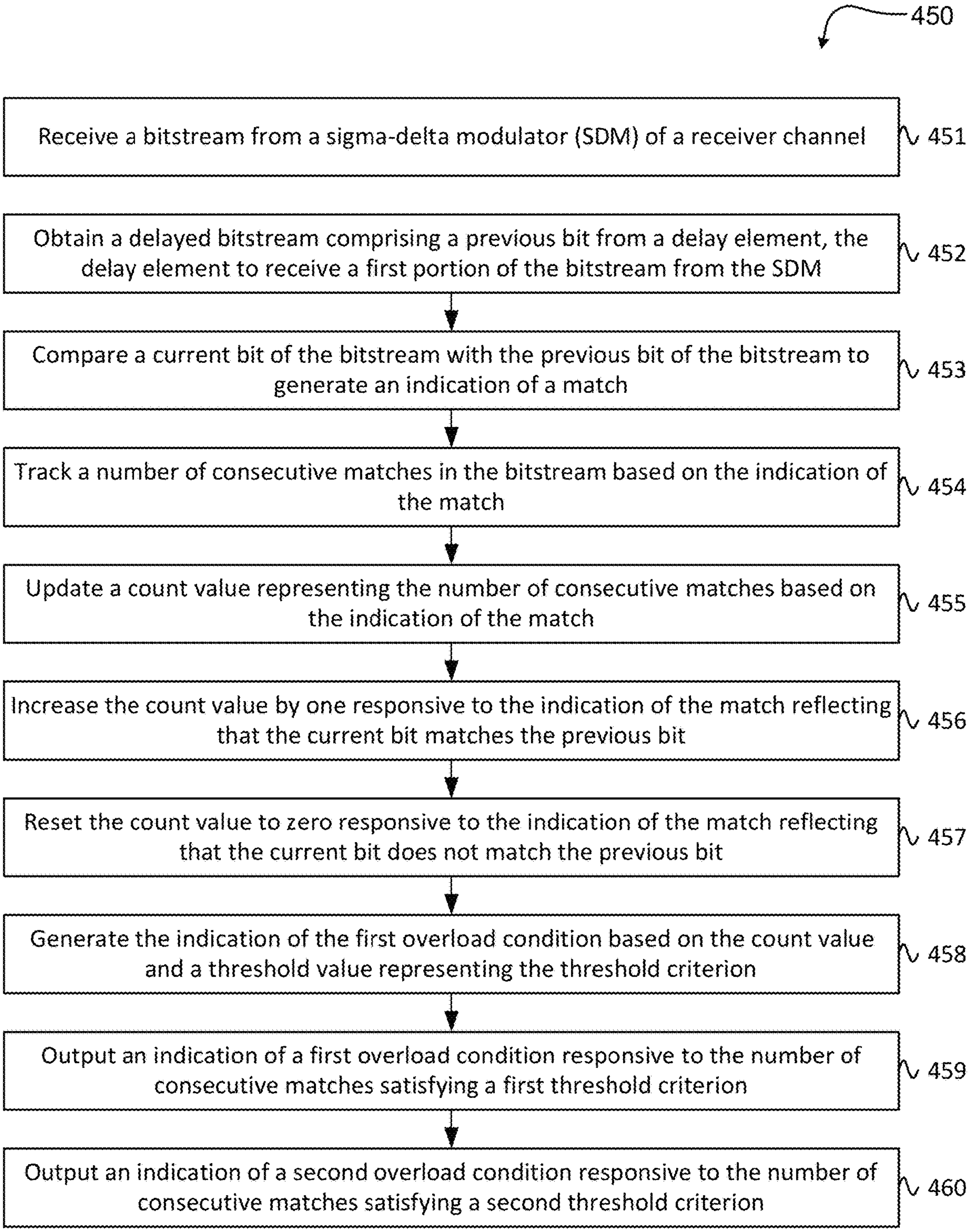
FIG. 4B is a flow diagram of an example method for generating an indication of an SDM overload condition, according to at least one aspect of the disclosure.

FIG. 4B is a flow diagram of an example method 450 for generating a sigma-delta modulator (SDM) overload indication, according to at least one aspect of the disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 450 can be performed by the overload detector circuit 110 of FIG. 1. Although illustrated in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more operations of the method 450 can be omitted in various embodiments. Thus, not all operations are required in every embodiment. Other process flows are possible.

At operation 451, processing logic (e.g., the overload detector circuit 110) receives a bitstream from a sigma-delta modulator (SDM) of a receiver channel.

At operation 452, the processing logic obtains a delayed bitstream including a previous bit from a delay element. The delay element receives a first portion of the bitstream from the SDM and outputs the delayed bitstream. In some embodiments, the operation 402 is optional, and the previous bit can be obtained by other methods or processes for the operation 403.

At operation 453, the processing logic compares a current bit of the bitstream with the previous bit of the bitstream to generate an indication of a match. In some embodiments, the previous bit of the bitstream is provided in the delayed bitstream for comparison to the current bit in a current bitstream.

At operation 454, the processing logic tracks a number of consecutive matches in the bitstream based on the indication of the match.

At operation 455, the processing logic updates a count value representing the number of consecutive matches based on the indication of the match. In some embodiments, the operation 455 is performed as a part of the operation 454.

At operation 456, the processing logic increases the count value by one responsive to the indication of the match reflecting that the current bit of the bitstream matches the previous bit of the bitstream. In some embodiments, the operation 456 and the operation 457 are performed as a part of the operation 455. It can be appreciated that either operation 456 or operation 457 will be performed based on the value of the indication of the match generated in operation 453.

At operation 457, the processing logic resets the count value to zero responsive to the indication of the match reflecting that the current bit of the bitstream does not match the previous bit of the bitstream. In some embodiments, the processing logic resets the count value to an initial value, or a default value. In some embodiments, the initial or default value for the count value is a non-zero value.

At operation 458, the processing logic generates an indication of a first overload condition based on the count value and a threshold value representing the threshold criterion. In some embodiments, the processing logic generates a second indication of a second overload condition based on the count value and a second threshold value representing a second threshold criterion. In some embodiments, the operation 458 is optional, and/or performed as a part of the operation 459.

At operation 459, the processing logic outputs the indication of the first overload condition responsive to the number of consecutive matches satisfying the first threshold criterion.

At operation 460, the processing logic outputs the indication of the second overload condition responsive to the number of consecutive matches satisfying the second threshold criterion. In some embodiments, and as described above, a first overload condition can indicate one state of the system including a touch screen sending the signal to the receiver, and the second overload condition can indicate a second state of the system. For example, in a touch screen, the first overload condition can indicate a brief mis-touch, and the second overload condition can indicate the presence of a foreign object pressed against the touch screen. In another example, a first overload condition can indicate that a signal from the touch screen is severely overloaded, and the resulting measurements of the signal should be ignored. A second overload condition can indicate that the signal from the touch screen is slightly overloaded, and the system can perform one or more of, for instance, (i) indicating that the signal is not reliable, (ii) ignoring the signal, or (iii) identifying patterns of the second overload condition and, as appropriate, tuning the system to a different operating frequency to counteract the patterned overloads.

Figure 5:
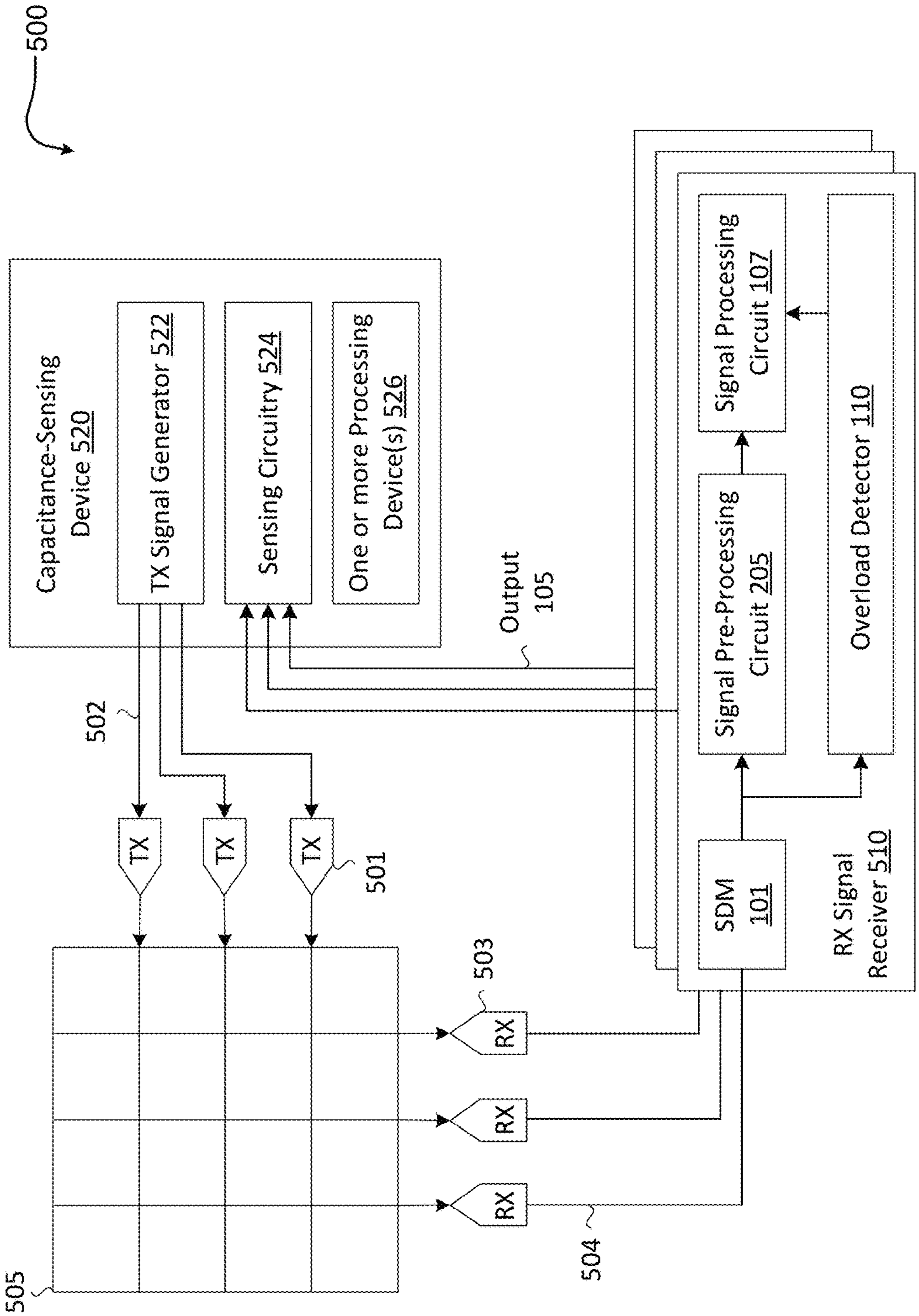
FIG. 5 illustrates a block diagram of a system for implementing a capacitance-sensing device with capacitance-sensing circuitry, according to at least one aspect of the disclosure.

FIG. 5 illustrates a block diagram of a system 500 implementing a capacitance-sensing device 520 with capacitance-sensing circuitry, according to at least one aspect of the disclosure. The system 500 provides at least one example of exciting and scanning with a sequence to support capacitive sensing. In some embodiments, the capacitance-sensing device 520 supports one or more of self-capacitance-sensing, mutual-capacitance-sensing, or the like. The system 500 includes a touch-controller architecture with a sensing grid 505 (e.g., a sense panel or capacitance matrix) with a rectangular array of sense electrodes. The rectangular array of sense electrodes can include an integer number, M, of TX electrodes 501 and an integer number, N, of RX electrodes 503. In at least one embodiment, multiplexers can connect the panel electrodes to one or more sense channels and multiplex signals sent to two or more of the TX electrodes 501 or received from two or more of the RX electrodes 503.

The system 500 can include capacitance-sensing circuitry, which can be capable of one or both of transmitting and receiving. In some embodiments, the TX signal generator 522 can generate TX signals 502 to be sent to the TX electrodes 501. In some embodiments, the TX signal generator 522 can select an excitation sequence for one or more of the TX signals 502. Further sensing circuitry 524 can include one or more RX signal receivers 510 that receive sense signals 504 from the RX electrodes 503 to detect a presence of an object (such as a finger or other conductive object) on a touch panel (e.g., sensing grid 505) of the system 500. The sense signals 504 represent capacitances associated with the RX electrodes 503. In particular, a first RX signal receiver of the sensing circuitry 524 (e.g., RX signal receiver 510) can receive first sense signal from a first RX electrode (e.g., an RX electrode 503), and a second RX signal receiver (not illustrated) can receive a second sense signal from a second RX electrode (e.g., an RX electrode 503).

The system 500 is configured to use the TX signal generator 522 to generate TX signals 502 and apply respective TX signals 502 to to each TX electrode 501. The system 500 uses the sensing circuitry 524 to receive indications of a touch (e.g., output 105 of FIG. 1A or FIG. 1B) from one or more RX signal receivers 510. In some embodiments, each RX electrode 503 is coupled to a respective RX signal receiver 510. In alternative embodiments, two or more RX electrodes 503 are coupled to an RX signal receiver 510. In some embodiments, and as described above with reference to FIG. 1A, FIG. 1B, and FIG. 2, the overload detectors 110 of the RX signal receivers provide an output 105 to a signal processing circuit, illustrated here as sensing circuitry 524. In some embodiments, the sense signals 504 are also provided to the sensing circuitry 524, either combined with the output 105 from the overload detector circuit 110, or independently as similarly described with reference to FIG. 1A, FIG. 1B, and FIG. 2 (e.g., as processing signal 106). Once received at the sensing circuitry 524, the processing signal 106 can be processed based on the output 105 of the overload detector circuit 110. In some embodiments, the output 105 indicates an overload condition for the SDM 101, and the sensing circuitry 524 rejects a portion of the processing signal 106 as a mis-touch (e.g., a mis-touch of the sensing grid 505). In some embodiments, the capacitance-sensing device 520 uses one or more processing device(s) 526 to detect the presence of an object on the sensing grid 505.

It will be apparent to one skilled in the art that at least some embodiments may be practiced without these specific details. In other instances, well-known components, elements, or methods are not described in detail or are presented in a simple block diagram format in order to avoid unnecessarily obscuring the subject matter described herein. Thus, the specific details set forth hereinafter are merely exemplary. Particular implementations may vary from these exemplary details and still be contemplated to be within the spirit and scope of the present embodiments.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Certain embodiments may be implemented by firmware instructions stored on a non-transitory computer-readable medium, e.g., such as volatile memory and/or non-volatile memory. These instructions may be used to program and/or configure one or more devices that include processors (e.g., CPUs) or equivalents thereof (e.g., such as processing cores, processing engines, microcontrollers, and the like), so that when executed by the processor(s) or the equivalents thereof, the instructions cause the device(s) to perform the described operations for Universal Serial Bus (USB) Type-C(USB-C) or USB Power Delivery (PD) mode-transition architecture described herein. The non-transitory computer-readable storage medium may include, but is not limited to, electromagnetic storage medium, read-only memory (ROM), random-access memory (RAM), erasable programmable memory (e.g., Erasable and Programmable Read Only Memory (EPROM) and Electrically Erasable and Programmable Read Only Memory (EEPROM)), flash memory, or another now-known or later-developed non-transitory type of medium that is suitable for storing information.

Although the operations of the circuit(s) and block(s) herein are shown and described in a particular order, in some embodiments the order of the operations of each circuit/block may be altered so that certain operations may be performed in an inverse order or so that certain operation may be performed, at least in part, concurrently and/or in parallel with other operations. In other embodiments, instructions or sub-operations of distinct operations may be performed in an intermittent and/or alternating manner.

In the foregoing specification, the disclosure has been described with reference to specific exemplary embodiments thereof. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense.

What is claimed is:

1. An overload detector circuit comprising:
- a first logic circuitry to receive a bitstream from a sigma-delta modulator (SDM) of a receiver channel, the first logic circuitry to compare a current bit of the bitstream with a previous bit of the bitstream and output an indication of a match; and
- a second logic circuitry to track a number of consecutive matches in the bitstream and output an indication of a first overload condition responsive to the number of consecutive matches satisfying a first threshold criterion.

2. The overload detector circuit of claim 1, wherein the first logic circuitry comprises:
- a delay element to receive a first portion of the bitstream from the SDM and output the previous bit of the bitstream; and
- a bit comparator to receive the current bit of the bitstream and the previous bit of the bitstream and generate the indication of the match.

3. The overload detector circuit of claim 2, wherein the delay element to output the previous bit of the bitstream in a delayed bitstream, and wherein the bit comparator to receive the bitstream and the delayed bitstream.

4. The overload detector circuit of claim 1, wherein the second logic circuitry comprises:
- a counter to update a count value representing the number of consecutive matches based on the indication of the match; and
- a comparator coupled to the counter, the comparator to receive the count value and a threshold value representing the first threshold criterion and generate the indication of the first overload condition.

5. The overload detector circuit of claim 4, wherein the counter to increase the count value by one responsive to the indication of the match reflecting that the current bit matches the previous bit, and wherein the counter to reset the count value to an initial value responsive to the indication of the match reflecting that the current bit does not match the previous bit.

6. The overload detector circuit of claim 1, the second logic circuitry to output an indication of a second overload condition responsive to the number of consecutive matches satisfying a second threshold criterion.

7. The overload detector circuit of claim 1, wherein the first threshold criterion is determined by at least one of software, firmware, or hardware.

8. A method comprising:
- receiving a bitstream from a sigma-delta modulator (SDM) of a receiver channel;
- comparing a current bit of the bitstream with a previous bit of the bitstream to generate an indication of a match;
- tracking a number of consecutive matches in the bitstream based on the indication of the match; and
- outputting an indication of a first overload condition responsive to the number of consecutive matches satisfying a first threshold criterion.

9. The method of claim 8, further comprising:
- obtaining a delayed bitstream comprising the previous bit from a delay element, the delay element to receive a first portion of the bitstream from the SDM; and
- comparing the current bit of the bitstream and the previous bit of the delayed bitstream to generate the indication of the match.

10. The method of claim 9, comparing the current bit of the bitstream and the previous bit of the delayed bitstream comprises comparing the bitstream to the delayed bitstream at a bit comparator coupled to the SDM.

11. The method of claim 8, further comprising:
- updating a count value representing the number of consecutive matches based on the indication of the match; and
- generating the indication of the first overload condition based on the count value and a threshold value representing the first threshold criterion.

12. The method of claim 11, further comprising:

increasing the count value by one responsive to the indication of the match reflecting that the current bit of the bitstream matches the previous bit of the bitstream; and resetting the count value to zero responsive to the indication of the match reflecting that the current bit of the bitstream does not match the previous bit of the bitstream.

13. The method of claim 8, further comprising:

outputting an indication of a second overload condition responsive to the number of consecutive matches satisfying a second threshold criterion.

14. The method of claim 8, wherein the first threshold criterion is determined by at least one of software, firmware, or hardware.

15. A system comprising:

a sigma-delta modulator (SDM) coupled to a receiver channel; and an overload detector circuit coupled to an output of the SDM, the overload detector circuit comprising:

a first logic circuitry coupled to the SDM, the first logic circuitry to compare a current bit of a bitstream received from the SDM with a previous bit of the bitstream and output an indication of a match; and a second logic circuitry coupled to the first logic circuitry, the second logic circuitry to track a number of consecutive matches in the bitstream and output an indication of a first overload condition responsive to the number of consecutive matches satisfying a first threshold criterion.

16. The system of claim 15, wherein the first logic circuitry comprises:

a delay element to receive a first portion of the bitstream from the SDM and output the previous bit of the bitstream; and a bit comparator to receive the current bit of the bitstream and the previous bit of the bitstream and generate the indication of the match.

17. The system of claim 15, wherein the second logic circuitry comprises:

a counter to update a count value representing the number of consecutive matches based on the indication of the match; and a comparator coupled to the counter, the comparator to receive the count value and a threshold value representing the first threshold criterion and generate the indication of the first overload condition.

18. The system of claim 17, wherein the counter to increase the count value by one responsive to the indication of the match reflecting that the current bit matches the previous bit, and wherein the counter to reset the count value to an initial value responsive to the indication of the match reflecting that the current bit does not match the previous bit.

19. The system of claim 15, the second logic circuitry to output an indication of a second overload condition responsive to the number of consecutive matches satisfying a second threshold criterion.

20. The system of claim 15, further comprising a touch sensor coupled to the receiver channel.

* * * * *